United States Patent [19]
Baliga

[11] 4,128,440
[45] Dec. 5, 1978

[54] LIQUID PHASE EPITAXIAL METHOD OF COVERING BURIED REGIONS FOR DEVICES

[75] Inventor: Bantval J. Baliga, Schenectady, N.Y.

[73] Assignee: General Electric Company, Schenectady, N.Y.

[21] Appl. No.: 899,118

[22] Filed: Apr. 24, 1978

[51] Int. Cl.² ........................................... H01L 21/208
[52] U.S. Cl. ................................... 148/171; 148/172
[58] Field of Search .......................... 148/171, 172, 173

[56] References Cited

U.S. PATENT DOCUMENTS

| 3,810,794 | 5/1974 | Antypas et al. | 148/172 |
| 3,984,262 | 10/1976 | Burnham et al. | 148/172 |
| 3,994,755 | 11/1976 | Kamath et al. | 148/172 |
| 4,053,334 | 10/1977 | Ehle et al. | 148/171 |

OTHER PUBLICATIONS

Batiga, J. of the Electrochemical Society, vol. 124, Oct. 1977, pp. 1627-1631.

Baliga, J. of the Electrochemical Society, vol. 125, Apr. 1978, pp. 598-600.

D'Asaro et al., Semiconductor Silicon, 1969, pp. 233-242.

Kim, J. of the Electrochemical Society, vol. 119, Oct. 1972, pp. 1394-1398.

Primary Examiner—G. Ozaki
Attorney, Agent, or Firm—Marvin Snyder; Joseph T. Cohen

[57] ABSTRACT

Buried regions of predetermined conductivity in silicon semiconductor devices are formed with substantially no out diffusion from the substrate and buried region, and with substantially no lateral autodoping, by diffusing the region into a monocrystalline silicon wafer doped to one conductivity type, and depositing silicon from a melt supersaturated with silicon and containing conductivity type determining impurities, epitaxially atop the wafer. The device is completed by performing conventional diffusion of conductivity type determining impurities into the epitaxially deposited layer.

17 Claims, 2 Drawing Figures

LIQUID PHASE EPITAXIAL METHOD OF COVERING BURIED REGIONS FOR DEVICES

INTRODUCTION

This invention relates to semiconductor device fabrication procedures, and more particularly to a method of employing a liquid phase epitaxial process to produce silicon semiconductor electronic devices with improved electronic characteristics.

Many silicon electronic devices require fabrication of buried structures of predetermined conductivity therein. Among the well-known applications of such structures are the buried collector region of a planar transistor and the buried collector in the bipolar transistor of integrated circuits. Such structures have heretofore been fabricated only by conventional vapor phase epitaxial processes. Use of vapor phase epitaxial processes in this type of application, however, involves two well-known disadvantages. First, the process requires a relatively high growth temperature, which leads to large out-diffusion from the substrate and buried layer. As a result, the p-n junctions formed by the substrate and buried layer, instead of being abrupt, tend to become more gradual. This results in reduced blocking voltage of the junction and even imposes lower limits on thickness of the epitaxial layer being formed (i.e., the epitaxial layer must be thicker than the out diffusion region). Second, the process exhibits autodoping; that is, some of the dopant in the region to be buried escapes into the vapor and redeposits in other areas of the epitaxial layer, causing unintentional nonuniformity in impurity concentrations.

The present invention allows formation of buried regions in silicon semiconductor devices by epitaxially growing silicon from the liquid phase. This process requires a much lower growth temperature than the conventional vapor phase epitaxial growth process (950° C. for epitaxial growth of silicon from the liquid phase as opposed to 1150° C. for epitaxial growth of silicon from the vapor phase). Because of the lower growth temperature involved, the liquid phase epitaxial growth process virtually eliminates out diffusion from the substrate and the buried region. Moreover, by employing melt supersaturation, autodoping of the epitaxial layer is prevented.

One of the well-known drawbacks in using vapor phase epitaxial growth of silicon in fabricating an electronic device is the difficulty in forming single crystal deposits only in desired regions; that is, this process normally results in formation of polycrystalline silicon deposits atop silicon regions masked by silicon oxide. These polycrystalline deposits must subsequently be removed, since they have large, sharp projections which are liable to damage photomasks employed on the device during its fabrication process. Moreover, if silicon deposits should be left to remain atop the oxide coating, they may provide one or more deleterious short-circuit paths on the epitaxially-deposited single crystal silicon between regions intended to be electrically isolated.

By use of the liquid phase epitaxial growth process of the present invention to fabricate an electronic device, the problems associated with presence of polycrystalline deposits on silicon oxide-coated regions of the device are nonexistent, since silicon epitaxially-deposited from the liquid phase will not adhere to silicon oxide. Hence, no silicon deposits, either monocrystalline or polycrystalline, form atop the oxide layer. Consequently, photomask damage due to large, sharp projections is avoided, as are undesired short circuits due to conduction over the silicon oxide layer, without requiring added processing steps to remove silicon deposited atop the silicon oxide layer.

Accordingly, one object of the invention is to provide an epitaxial growth process for forming a buried region of predetermined conductivity in silicon semiconductor devices without causing out diffusion from the substrate and buried region.

Another object is to provide an epitaxial growth process for forming silicon semiconductor electronic devices at significantly lower growth temperatures than employed in vapor phase epitaxial growth processes.

Another object is to provide a process for forming silicon semiconductor electronic devices wherein epitaxial growth of silicon on selected regions, without formation of polycrystalline silicon deposits on other regions, is readily achieved.

Briefly, in accordance with a preferred embodiment of the invention, a method of forming a buried region in a monocrystalline silicon wafer comprises the steps of forming a region of predetermined conductivity type within the wafer, and depositing silicon from a melt supersaturated with silicon and containing conductivity type determining impurities, epitaxially atop the wafer and the region of predetermined conductivity type to form a silicon substrate thereon of conductivity type determined by the impurities in the melt.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

Figure 1:
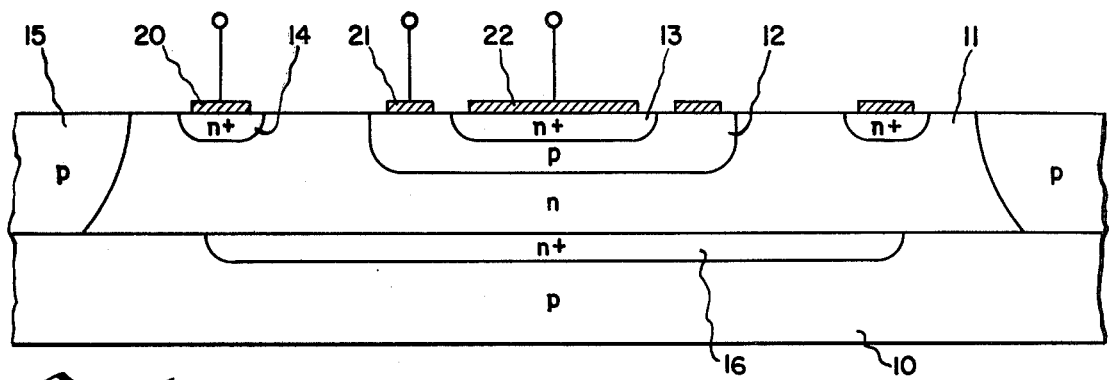
FIG. 1 is a sectional view of a bipolar planar transistor fabricated in accordance with the process of the instant invention.

FIG. 1 illustrates a planar transistor, or integrated circuit transistor, fabricated by the process of the invention. The transistor includes a monocrystalline silicon substrate 10 of one conductivity type, such as p type. A collector region 11 of opposite conductivity type, in this instance n type, is situated atop substrate 10. A base region 12 of the one conductivity type is formed in contact with collector region 11, and an emitter region 13 is formed in contact with base region 12. A low resistivity region 14 of the same type conductivity as that of collector region 11 is formed within the collector region to facilitate good contact thereto, and is contacted by a metallic electrode 20. Metallic electrodes 21 and 22 are provided to make contact with the base and emitter regions, respectively. For operation within an integrated circuit, isolation region 15 of the one conductivity type is formed around the transistor structure and extends through the entire maximum thickness of collector region 11, from the upper surface of the device to the interface with substrate 10, in order to prevent undesired interaction with other transistors fabricated on the same substrate.

Since transistor operation is well known, it should suffice to say that emitter-to-base voltage determines current flow through the collector. It is also well known, however, that parasitic elements, such as resistive regions, exist within transistor structures and must be dealt with in any effort to maximize transistor performance. One well-known parasitic resistance region exists in the portion of the collector region not situated directly beneath the emitter region; that is, a resistance path may be produced between the collector region and the substrate. To avoid such parasitic resistance, a buried layer of high conductivity, opposite to the conductivity of the substrate, is employed atop the substrate and extends outward beneath the collector-base junction to at least the outer periphery of the collector electrode. Thus, in FIG. 1, a buried layer 16 of $n^+$ conductivity is shown beneath the junction between collector region 11 and base region 12, and extending outward beyond the outer periphery of collector electrode 20. Presence of buried layer 16 reduces collector series resistance.

Formation of buried layer 16 has heretofore been accomplished by diffusing into a silicon substrate of predetermined conductivity type a low resistivity region of opposite conductivity type, and thereafter depositing atop the substrate, by vapor phase epitaxial methods, a silicon layer of opposite conductivity type. Regions of predetermined conductivity types are then formed in the epitaxially-deposited layer to complete fabrication of the desired silicon semiconductor device.

One problem associated with this prior method of forming buried layer 16 is that the vapor epitaxial process requires fabrication temperatures of about 1150° C. At temperatures this high, out-diffusion from the silicon substrate and the buried region occurs, preventing formation of a desirably abrupt junction both in the substrate and between the undiffused substrate and the epitaxial layer grown thereon. The diffusion of impurities from the buried layer into the epitaxially-grown layer, moreover, causes a gradation in impurity levels in the collector region. As a result, the performance characteristics of the electronic device thus produced are inadequate with respect to their design objectives.

Another problem associated with the prior method of producing buried layers using vapor phase epitaxial growth is that of autodoping. Specifically, the dopant in the region to be buried escapes into the vapor and is redeposited in other portions of the epitaxial layer. This phenomenon thus interferes with precise control of doping levels in both the epitaxial and buried layers.

By employing liquid phase epitaxial growth of silicon, a much lower growth temperature, approximately 950° C. is employed. I have found that at this temperature, out diffusion from the substrate and buried regions is virtually eliminated, so that abrupt junctions are consistently produced. Moreover, by using a supersaturated melt for doping, no autodoping of the epitaxial layer occurs.

In fabricating a silicon semiconductor device by liquid phase epitaxial growth, such as the transistor shown in FIG. 1, a commercially-procured wafer 10 typically of about 6–8 mils thickness and doped at a p-type impurity level of about $5 \times 10^{13}$ atoms/cc, has a region 16 formed therein, preferably by diffusion, to a depth of about 1 micrometer with a surface concentration in the range of $1 \times 10^{19}$–$1 \times 10^{20}$ atoms/cc of n-type impurities. Those skilled in the art will appreciate that the doping level of substrate 10 is at least an order of magnitude lower than that which would be employed if the device were to be fabricated by vapor phase epitaxial methods. Thereafter, a layer of silicon doped at an n type impurity level of $5 \times 10^{14}$–$5 \times 10^{16}$ atoms/cc is deposited atop substrate 10 and region 16 to a thickness of 0.5 mils by the liquid phase epitaxial process of the instant invention, burying region 16. This epitaxially-deposited layer may then be further processed so that a semiconductor device, such as the transistor illustrated in FIG. 1, is fabricated. Hence, a p-type base region 12 may be diffused into the epitaxially-deposited layer at a doping level surface concentration of $1 \times 10^{17}$ to $5 \times 10^{18}$ atoms/cc to a depth of 0.5–1 micrometer below an $n^+$ type emitter region 13 therein which, in turn, is diffused to a depth of 1–2 micrometers with a doping level surface concentration of $1 \times 10^{20}$ atoms/cc. Isolation regions 15 may be fabricated in the epitaxially grown layer by diffusing p type impurities therein completely through the entire thickness of the epitaxially-grown layer at a doping level surface concentration of $1 \times 10^{19}$ atoms/cc. To insure good contact to the collector region, high conductivity collector contact region 14 may be diffused into collector 11 to a depth of about 0.5–1 micrometers at a surface concentraion of about $1 \times 10^{20}$ atoms/cc of n type determing impurities. These diffusions are achieved by conventional photolithographic techniques, as is the metallic deposition, which may be performed using an evaporation process and which results in formation of electrodes 20, 21 and 22.

Figure 2:
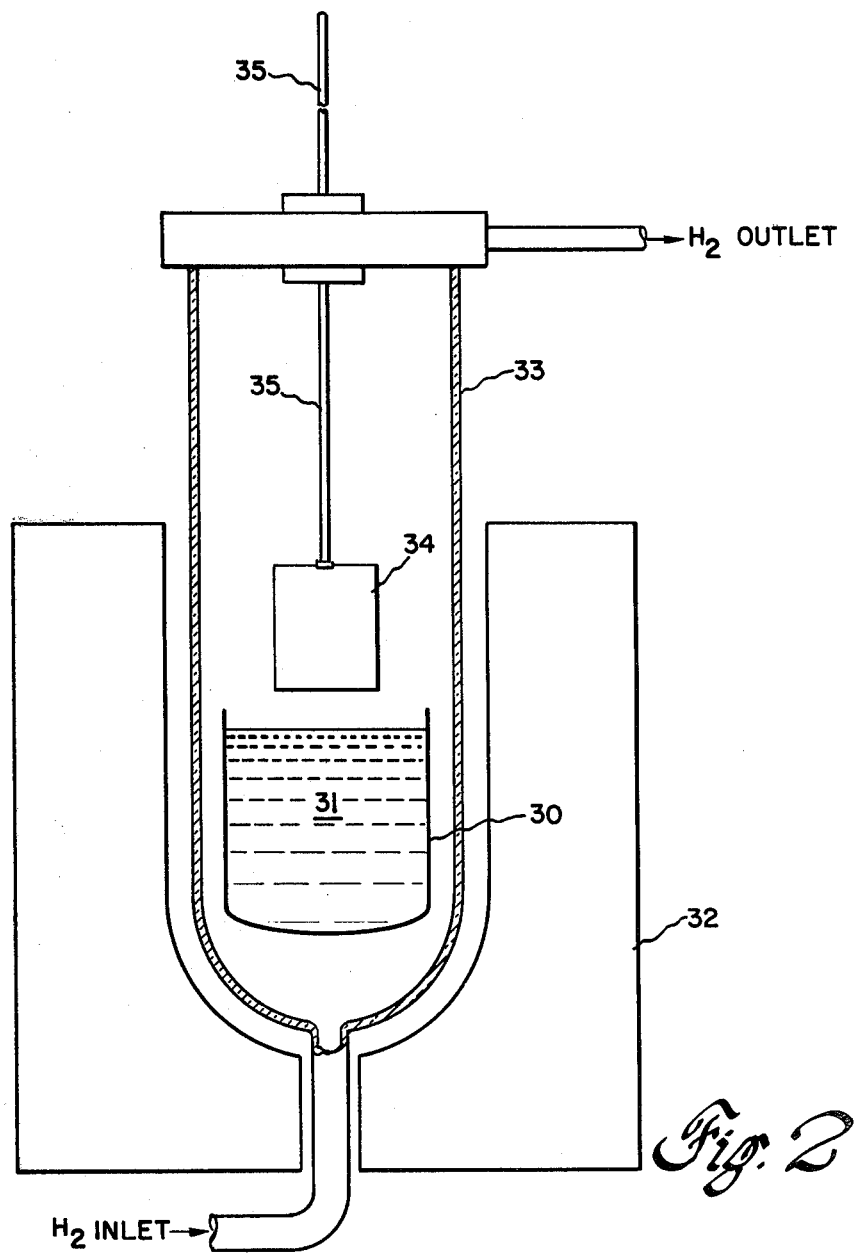
FIG. 2 is a schematic diagram of apparatus employed in practicing the instant invention.

The liquid phase epitaxial process is typically performed using apparatus such as shown schematically in FIG. 2. Thus, a crucible 30, containing a melt of conductivity-type determining impurities 31 is heated in a reducing atmosphere. For expitaxially depositing a silicon layer containing n-type or p-type impurities, a melt of high purity tin is preferably employed, heated to a temperature of 950° C. in a resistance furnace 32 in a hydrogen atmosphere. Alternatively, a tin-lead melt may be employed. The crucible is preferably contained in a quartz tube 33 with the flow of hydrogen gas, as illustrated by the arrows in FIG. 2, preferably being from the bottom of tube 33 toward the top. A wafer holder 34, preferably made of quartz, is attached to a vertical rod 35, also preferably fabricated of quartz, which raises and lowers holder 34.

Prior to growth, tin melt 31 is saturated with silicon from a silicon wafer dipped therein by holder 34. The wafer is preferably of 100-ohms cms resistivity, phosphorus-doped, if an n-type conductivity layer is to be epitaxially grown. During saturation, the melt is preferably stirred by oscillation of holder 34 about a vertical axis. The saturation is conducted until no further loss in weight of the saturation wafer can be detected. I have found that 0.47 grams of silicon are required to saturate a fresh 99 gram tin melt at 950° C. After each epitaxial growth, the silicon in the melt is preferably replenished using the same procedure.

The epitaxial layer may typically be grown on a (111) oriented, 0.01 ohm-cm, boron-doped silicon substrate. The substrate, after diffusion of layer 16 therein, is dipped in dilute hydrofluoric acid just before loading into wafer holder 34. The substrate temperature is brought up to the melt temperature by holding the wafer above the melt for about 10 minutes. The wafer is thereafter inserted into the melt, and the melt temperature is lowered at a controlled cooling rate which may range from 0.2° to 7° C. per minute. The melt is preferably supersaturated at the temperature at which the substrate wafer is introduced therein, so that no meltback of the substrate occurs prior to epitaxial growth. This supersaturation can be achieved by dissolving silicon in the melt at temperatures above the growth temperature, or temperature at which the substrate is subsequently introduced into the melt. For example, if the substrate (with the diffused region) is to be introduced into the melt at 950° C., the melt becomes supersaturated by dissolving silicon in it at about 5° C. to 50° C. above the growth temperature (here 950° C.) and then lowering the temperature of the growth temperature, (i.e., 950° C.). During cooling, silicon containing the implanted conductivity type determining impurities precipitates out of solution and onto the substrate epitaxially. Growth times may range from a few minutes up to several hours, depending upon the cooling rate, to achieve undercooling of the melt of up to 100° C., the epitaxial growth having been initiated at 950° C. After the growth period, the substrate is removed from the melt before furnace cooling is terminated, in order to avoid any possible melt-back effects (i.e., penetration of tin into the silicon substrate). In the event any tin is found to be present on the bottom edge of the wafer after growth, it is preferably removed by etching in aqua regia. Thereafter, processing of the device to completion in conventional fashion proceeds as indicated above.

The foregoing describes an epitaxial growth process for forming a buried region of predetermined conductivity in silicon semiconductor devices without causing out diffusion and autodoping from the substrate and buried region. The epitaxial growth oricess allows fabrication of silicon semiconductor electronic devices at significantly lower growth temperatures than employed in vapor phase epitaxial growth processes. The process allows formation of silicon semiconductor electronic devices wherein epitaxial growth of silicon on selected regions, without formation of polycrystalline silicon deposits on other regions, is readily achieved. The process may, furthermore, be employed in fabricating other types of semiconductor structures, such as buried grid regions in the manner described and claimed in B. J. Baliga application Ser. No. 899,119 filed concurrently herewith and assigned to the instant assignee.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. The method of forming a buried region in a monocrystalline silicon wafer, said buried region being of predetermined conductivity type, comprising the steps of:
   forming a region of said predetermined conductivity type within said monocrystalline silicon wafer; and
   depositing silicon from a melt of conductivity type determining impurities supersaturated with silicon, epitaxially atop said wafer and said region of predetermined conductivity type to form a silicon layer thereon of conductivity type determined by said impurities in said melt.

2. The method of claim 1 including the additional step of forming regions of predetermined conductivity types in contact with said silicon deposited epitaxially atop said wafer in order to produce a completed semiconductor electronic device.

3. The method of claim 1 wherein the step of forming said region of predetermined conductivity type in said monocrystalline silicon wafer comprises diffusing impurities into said wafer to a predetermined surface concentration.

4. The method of claim 3 including the additional step of forming regions of predetermined conductivity types in contact with said silicon deposited epitaxially atop said wafer in order to produce a completed semiconductor electronic device.

5. The method of forming a buried region of predetermined resistivity in a silicon semiconductor electronic device, comprising the steps of:
   diffusing, into a monocrystalline silicon wafer doped to one conductivity type by a predetermined concentration of specific impurities therein, other impurities to a predetermined concentration therein to form a region of opposite conductivity type in said wafer;
   depositing silicon from a melt of conductivity type determining impurities supersaturated with silicon, epitaxially atop said wafer and said region of opposite conductivity type to form a layer of silicon of said opposite conductivity type; and
   forming regions of predetermined conductivity types in said silicon deposited epitaxially atop said wafer in order to provide the remaining necessary component regions of said electronic device.

6. The method of claim 5 wherein said step of depositing silicon from a melt of conductivity type determining impurities comprises dipping said wafer into said melt at a time when said melt is heated to a temperature at which it is supersaturated with silicon, and reducing the temperature of said melt at a predetermined rate for a predetermined period of time while said wafer is immersed in said melt.

7. The method of claim 6 wherein said melt comprises tin at a temperature of about 950° C. when said melt is supersaturated with silicon.

8. The method of claim 7 wherein said melt is saturated with silicon of n type conductivity at a temperature in the range of about 5° C. to 50° C. above the growth temperature.

9. The method of claim 7 wherein said melt is saturated with silicon of p type conductivity at a temperature in the range of about 5° C. to 50° C. above the growth temperature.

10. The method of claim 6 wherein said melt is supersaturated with silicon of n type conductivity prior to dipping said wafer into said melt.

11. The method of claim 6 wherein said melt is supersaturated with silicon of p type conductivity prior to dipping said wafer into said melt.

12. The method of claim 6 including the step of heating said wafer to said melt temperature prior to dipping said wafer into said melt.

13. The method of claim 12 wherein said melt comprises tin at a temperature of approximately 950° C. when said wafer is dipped therein.

14. The method of claim 5 including the step of maintaining said melt and said wafer in a reducing atmosphere.

15. The method of claim 14 wherein the step of depositing silicon from a melt of conductivity type determining impurities comprises dipping said wafer into said melt at a time when said melt is heated to a temperature at which it is supersaturated with silicon, and reducing the temperature of said melt at a predetermined rate for a predetermined period of time while said wafer is immersed in said melt.

16. The method of claim 15 wherein said melt comprises tin at a temperature of approximately 950° C. when said melt is supersaturated with silicon.

17. The method of claim 15 including the step of heating said wafer to said melt temperature prior to dipping said wafer into said melt.

* * * * *